(12) United States Patent
Smiley

(10) Patent No.: US 6,459,297 B1
(45) Date of Patent: Oct. 1, 2002

(54) SYSTEM FOR PROGRAMMING FIELD PROGRAMMABLE DEVICES

(75) Inventor: David A. Smiley, Peoria, AZ (US)

(73) Assignee: AG Communication Systems Corporation, Phoenix, AZ (US)

( * ) Notice: Subject to any disclaimer, the term of this patent is extended or adjusted under 35 U.S.C. 154(b) by 0 days.

(21) Appl. No.: 09/399,571

(22) Filed: Sep. 20, 1999

(51) Int. Cl.[7] .............................................. H03K 19/77
(52) U.S. Cl. ......................................... 326/38; 326/41
(58) Field of Search ..................................... 326/37–41

(56) References Cited

U.S. PATENT DOCUMENTS

| | | | | | |
|---|---|---|---|---|---|
| 5,493,239 A | * | 2/1996 | Zlotnick | ...................... | 326/38 |
| 5,737,235 A | * | 4/1998 | Kean et al. | ..................... | 326/38 |
| 5,751,163 A | * | 5/1998 | Tang et al. | ..................... | 326/38 |
| 6,034,542 A | * | 3/2000 | Ridgeway | ..................... | 326/39 |

* cited by examiner

*Primary Examiner*—Don Phu Le
(74) *Attorney, Agent, or Firm*—David J. Zwick

(57) ABSTRACT

A system for programming field programmable devices (FPDs) of different types across different boards. An in-system programmable master (ISPM) communicates over a bus to in-system programmable slaves (ISPSs) on one or more boards. FPDs on each board are connected into chains of the same type, and each chain is connected to an ISPS located on the board. The ISPM uses a packet protocol to communicate with all ISPSs in a system. Each packet comprises an ISPS address field, a chain select field, and a command field. Each ISPS reads packets addressed to it, and decodes and transmits the commands to the selected FPD chain in a protocol appropriate to the chain.

3 Claims, 3 Drawing Sheets

SYSTEM FOR PROGRAMMING FIELD PROGRAMMABLE DEVICES

FIELD OF THE INVENTION

The present invention relates to the programming of in-system programmable devices, and more particularly to programming such devices across multiple system boards.

BACKGROUND OF THE INVENTION

In-system programmable (ISP) programmable logic devices (PLDs) allow for the programming of the devices. after they have been soldered into place on a board. Typically, in-system programming is done when the board is in the testing phase of the manufacturing process, or during an upgrade operation when an external programmer is attached to the board while the board is in a system cabinet or when the board is removed from the cabinet and programmed on an external programmer. These programming methods suffer the disadvantages of having to program all the boards in a system one at a time, and, in the case of system upgrades, often having to remove each board from the system for programming. Another disadvantage of typical programming methods is that they usually require separate board-edge connections for each separate ISP PLD vendor represented on the board. In addition to PLDs, there often are other field programmable devices (FPDs) on a board, such as programmable memories and programmable analog devices. Typical in-system programming methods to reprogram these devices also suffer from some of the same disadvantages in that each board has to be programmed one at a time, and often has to be removed from the system.

SUMMARY OF THE INVENTION

The present invention provides a system for the programming of FPDs of different types and manufactures across different system boards. The system uses an in-system programmable master (ISPM) that communicates over a bus to in-system programmable slaves (ISPSs) located on one or more system boards. FPDs on each board are connected into separate chains of like type, and each chain is connected to an ISPS located on the board. Each ISPS is capable of programming all of the FPDs on a board in the protocol appropriate to the FPD.

Each ISPS has a unique address, and each FPD chain on an ISPS has a different address. The ISPM uses a packet based protocol to communicate with all ISPSs in a system. Each packet comprises an ISPS address field, a chain select field, a command field and a data field. Each ISPS reads packets addressed to it, translates the commands into the appropriate protocol, and communicates with the selected FPD chain to perform the requested programming functions. In a system having multiple FPD chains that are loaded with the same program, e.g., a telecommunication system with multiple identical line cards, provision is made to program like FPD chains across multiple boards at the same time.

DESCRIPTION OF THE PREFERRED EMBODIMENT

Figure 1:
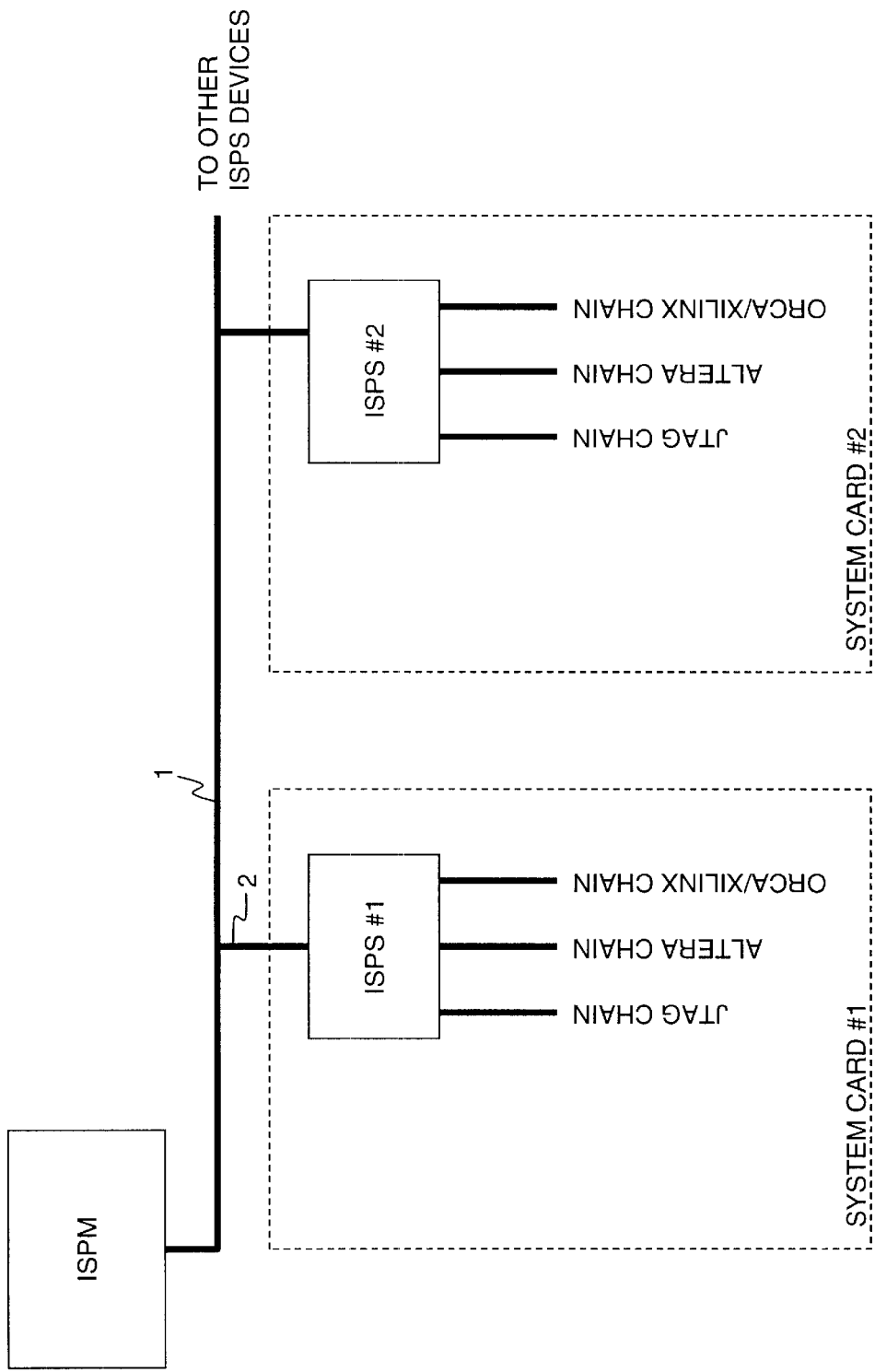
FIG. 1 shows a block diagram of the preferred embodiment of the present invention.

FIG. 1 shows a block diagram of the preferred embodiment of the present invention. In-system programmable master, ISPM communicates with one or more in-system programmable slaves, two of which are indicated in FIG. 1 as ISPS #1 and ISPS #2, over ISP Bus 1. Typically, each ISPS is located on a separate system card, and ISP Bus 1 is on the backplane. For certain configurations, it may be advantageous for more than one ISPS to be located on a single card. Each ISPS communicates with ISP Bus 1 over a connection 2.

The FPDs on each card are connected into separate chains of the same programming type in a programming configuration appropriate to the FPD type. Each chain is connected to a programming interface on the ISPS corresponding to the FPD programming type. The ISP programming system of the preferred embodiment supports the programming of devices such as JTAG compatible ISP devices, the XC4000 family of devices by Xilinx, Inc., the ORCA® 2C and 3C series of field programmable gate arrays by Lucent Technologies, Inc., and the MAX® family of ISP-capable devices by Altera Corporation. As indicated on FIG. 1, devices to be programmed using the JTAG convention would be connected to the JTAG CHAIN connection, the Altera ISP devices would be connected to the ALTERA CHAIN connection, and the Orca and Xilinx devices, which use similar ISP programming conventions, would be connected to the ORCA/XILINX CHAIN connection.

In-system programmable master ISPM typically would be a system host processor connected to the ISP bus. The ISPM reads an input file from a memory or magnetic storage containing programming commands for the target FPD device types, translates the commands into the packet based protocol of the present invention, and transmits the packets onto the ISPL bus. In general, programming is completed on a given device type chain before programming begins on another device type chain. However, during required programming wait states on one FPD chain, a time advantage may be gained by commencing or continuing programming on another FPD chain. In the preferred embodiment, the ISPM command input file format uses the higher level command languages developed by industry to aid in the programming of various FPD devices. For example, to program JTAG compatible devices, the ISPM command file statements may follow the Serial Vector Format specification developed by Texas Instruments and Teradyne. Although use of these high level command languages eases the tasks associated with program development and program maintenance, the ISPM can be programmed to read any FPD command language and produce appropriate command packets for transmission onto the ISP bus.

The ISP function would be invoked, for example, automatically at power up, or manually through crafts person intervention. In the preferred embodiment, the host processor communicates with ISP bus 1 through the SPI port of a Motorola, Inc. model MPC860 PowerQUICC™ communications controller. The SPI port parameters are set as follows:

CI—Clock Invert. Set to 0. Sets inactive state of clock as 0.

CP—Clock Phase. Set to 0. Sets clock toggles at the middle of the transfer.

DIV16—Divide by 16. Set to 0. Sets use BRGCLK.

REV—Reverse Data. Set to 0. Sets reverse data, send least significant bit first.

M/S—Master/Slave. Set to 1. Sets SPI as master.

LEN—Character Length. Set to 0xF for address/command, transfers. Set to 0x4 to 0xN as appropriate for: data transfers.

PM—Prescale Modulus Select. Set to 0x0. Sets ISP clock at 8.125 MHz for a 33 MHz system clock.

Operation of the MPC860 is described in "MPC860 PowerQUICC™ User's Manual," 1998, Motorola, Inc, which is hereby incorporated by reference.

Communication from the in-system programmable master ISPM to an ISPS is through a proprietary packet based protocol. Each packet comprises an ISPS address field, a chain select field, a command field and a data field. Each ISPS reads the packet address, and if the address is valid for the ISPS, it translates the commands into the appropriate ISP programming protocol, and communicates with the selected FPD chain to perform the requested programming functions.

Figure 2:
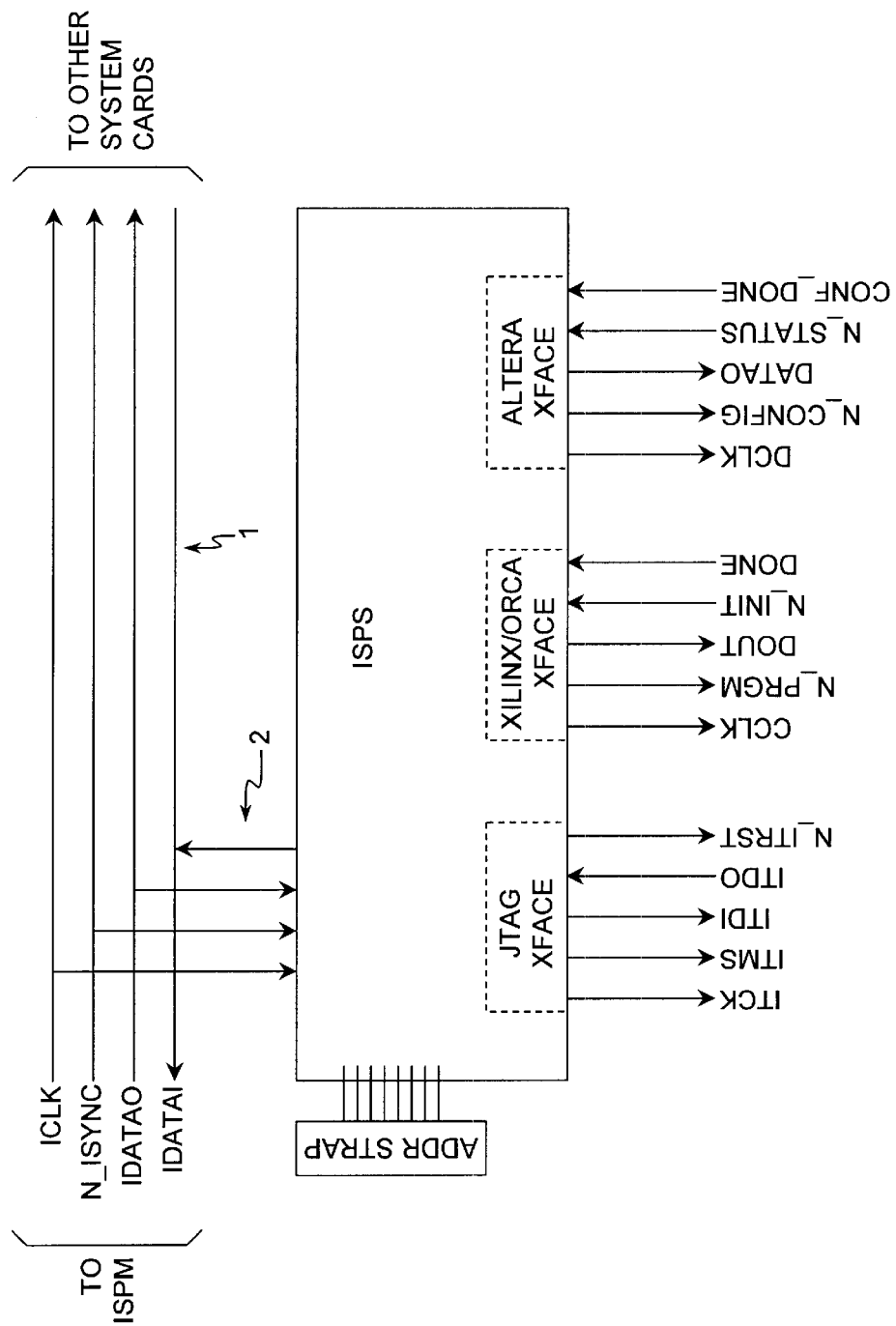
FIG. 2 shows a block diagram of the ISPS of the preferred embodiment of the present invention detailing the external connections of the ISPS to the ISP bus and to the FPD chains.

FIG. 2 is a block diagram of the preferred embodiment of the present invention that shows ISP bus 1 signals and the ISPS FPD programming chain connections in more detail.

ISP bus 1 uses a four-wire interface that is common to all ISPSs. The bus signals are driven from the host processor with a suitable backplane driver. In the preferred embodiment, the backplane driver uses a slow edge rate to minimize backplane noise while operating, and the bus is unterminated to allow for the range of loading that may be present.

The ISP bus 1 signals are as follows:

ICLK—ISP Bus Clock. This signal is only active while in-system programmable master ISPM is communicating with an ISPS. Otherwise, the signal is set to logic 0. The frequency is governed by the requirements of the FPD chain programming type, and typically ranges from 0 MHz to 10 MHz.

N_ISYNC—ISP Sync. This is an active low signal that is asserted while information is being sent to an ISPS. This signal is asserted before the first bit of the ISP address and is de-asserted after the last transferred bit. An external pullup is required for this signal when used with an MPC860.

IDATAO—ISP Data Out. This signal carries serial data from in-system programmable master ISPM to an ISPS.

IDATAI—ISP Data In. This signal carries serial data from an ISPS back to in-system programmable master ISPM. Only the addressed ISPS will drive this signal. Otherwise, this signal will remain tri-stated. An external pullup resistor is required for this signal.

In the preferred embodiment, ISP bus 1 is a synchronous serial bus with data on signal IDATAO shifted out by in-system programmable master ISPM on the negative edge of clock signal ICLK, and sampled by an ISPS on the positive edge of clock signal ICLK. In similar manner, data on signal IDATAI is shifted out by an ISPS on the negative edge of clock signal ICLK, and sampled by in-system programmable master ISPM on the positive edge of clock signal ICLK. This arrangement helps to eliminate clock-to-data skew problems on ISP bus 1.

The FPD programming chain connections are governed by the programming conventions of the corresponding FPD type. Brief definitions of the signals carried on the connections is given below.

For JTAG FPDs connected to the JTAG interface, the devices should be daisy-chained together, with TDO of a preceding device connected to TDI of a subsequent device. The head-of-chain device accepts data from the JTAG interface through the device's TDI connection. The end-of-chain device provides data output to the JTAG interface through its TDO connection. Signals on the JTAG interface are as follows:

ITCK—Test Clock. This signal connects to the TCK input of all FPD devices in this chain.

ITMS—Test Mode Select. This signal connects to the TMS input of all FPD devices in this chain.

ITDI—Test Data Input. Data from the ISPS is transmitted to the FPD chain on this signal. This signal connects to the TDI input of the first FPD chain device.

ITDO—Test Data Output. Data from the FPD chain is transmitted to the ISPS on this signal, and is then transmitted to in-system programmable master ISPM over ISP bus signal IDATAI. This signal connects to the TDO output of the last FPD chain device.

N_ITRST—Test Reset. This signal connects to the TRST input of all FPD devices on this chain.

A description of these signals and programming techniques of JTAG FPD devices can be found in standards publication "1149.1-1990 IEEE Standard Test Access Port and Boundary-Scan Architecture," 1993, Institute of Electrical and Electronics Engineers, Inc. (IEEE), and "Serial Vector Format Specification," Revision D, July 1997, ASSET InterTech, Inc., both of which are hereby incorporated by reference.

For FPDs connected to the Xilinx/ORCA SRAM-based interface, the devices should be daisy-chained together, with DOUT of a preceeding device connected to DIN of a subsequent device. The head-of-chain device accepts data from the Xilinx/ORCA interface through the device's DIN connection.

Signals on the Xilinx/Orca interface are as follows:

CCLK—Programming Clock. This signal connects to the CLK input of all FPD devices in this chain.

N_PRGM—Program Command. This signal connects to the PRGMN input of all FPD devices in this chain. An external pullup is required for this signal.

DOUT—Program Data Out. Data from the ISPS is transmitted to the FPD chain on this signal. This signal connects to the DIN input of the first FPD chain device.

N_INIT—INIT Complete. This signal connects to the INITN output of all FPD devices in this chain, and is then transmitted to in-system programmable master ISPM over ISP bus signal IDATAI. An external pullup is required for this signal.

DONE—Programming Complete. This signal connects to the DONE output of all FPD devices in this chain, and is then transmitted to in-system programmable master ISPM over ISP bus signal IDATAI. An external pullup is required for this signal.

A description of these signals and programming techniques of Xilinx FPD devices can be found in "The Programmable Logic Data Book," February 1999, Xilinx, Inc., which is hereby incorporated by reference. A description of ORCA programming techniques can be found in "ORCA® Series 3C and 3T Field-Programmable Gate Arrays," June 1999, Lucent Technologies Inc., which is hereby incorporated by reference.

For FPDs connected to the Altera SRAM-based interface, the devices should be daisy-chained together, with nCEO of a preceeding device connected to nCE of a subsequent device, and nCE for the head-of-chain device grounded. Also, the MSEL lead of each FPD is pulled low.

Signals on the Altera interface are as follows:

DCLK—Programming Clock. This signal connects to the DCLK input of all FPD devices in this chain.

N_CONFIG—Program Command. This signal connects to the nCONFIG input of all FPD devices in this chain.

DATAO—Program Data Output. Data from the ISPS is transmitted to the FPD chain on this signal. This signal connects to the DATA input of all FPD devices in this chain.

N_STATUS Program Status Output. This signal connects to the nSTATUS output of all FPD devices in this chain, and is then transmitted to in-system programmable master ISPM over ISP bus signal IDATAI. An external pullup is required for this signal.

CONF_DONE—Programming Complete. This signal connects to the CONF_DONE output of all FPD devices in this chain, and is then transmitted to in-system programmable master ISPM over ISP bus signal IDATAI. An external pullup is required for this signal.

A description of these signals and programming techniques of Altera FPD devices can be found in Application Note 87, "Configuring FLEX 6000 Devices," Version 1, June 1997, Altera Corporation, and Application Note 95, "In-System Programmability in MAX Devices," Version 1, February 1998, Altera Corporation, both of which are hereby incorporated by reference.

An ISP bus information transfer packet from in-system programmable master ISPM to an ISPS is a variable length packet consisting of two eight-bit words comprising an address field and a command select field, and, if the command is data driven, followed by a data field of at least one bit. The bit definitions for the first two words are as follows:

Word 1, bit 7—Address bit 7—CARD_SLOT_ID_3
Word 1, bit 6—Address bit 6—CARD_SLOT_ID_2
Word 1, bit 5—Address bit 5—CARD_SLOT_ID_1
Word 1, bit 4—Address bit 4—CARD_SLOT_ID_0
Word 1, bit 3—Address bit 3—ISPS_ID_4
Word 1, bit 2—Address bit 3—ISPS_ID_3
Word 1, bit 1—Address bit 1—ISPS_ID_2
Word 1, bit 0—Address bit 0—ISPS_ID_1
Word 2, bit 7—Chain select bit 3
Word 2, bit 6—Chain select bit 2
Word 2, bit 5—Chain select bit 1
Word 2, bit 4—Chain select bit 0
Word 2, bit 3—Command Select bit 3
Word 2, bit 2—Command Select bit 2
Word 2, bit 1—Command Select bit 1
Word 2, bit 0—Command Select bit 0

In the preferred embodiment, each ISPS is identified by an eight-bit address strap field. Word 1, bits (7:4) are composed of a CARD_SLOT_ID parameter that is strapped from the cabinet backplane when a system card having an ISPS is installed. Word 1, bits: (3:0) come from an ISPS_ID value that is strapped on the card.

Each ISPS can be strapped with a unique ISPS_ID value, or multiple ISPSs can be strapped with the same ISPS_ID value. In systems having multiple boards of the same type, the invention of Applicant allows for parallel programming of all FPD chains of the same type. In this arrangement, all boards of the same type would be strapped with the same ISPS_ID. In the address field of the information transfer packet, CARD_SLOT_ID would be loaded with a value of, for example, '1111', and ISPS_ID would have the desired same-type strapped ISPS_ID. Each ISPS recognizes the '1111' value of CARD_SLOT_ID as a broadcast address, and accepts the packet based only on the value of ISPS_ID. In this manner, every ISPS in the system having the same ISPS_ID value will accept the information transfer packet and perform the same operations. In the preferred embodiment, this parallel programming technique will only work for the SRAM-based FPDs, as the JTAG-based FPDs use two way communication such that only one JTAG chain can be active at a time.

Word 2 contains the command select field. The command select field comprises two parameters: chain select and command field. Word 2, bits (7:4) identify to which FPD chain on the addressed ISPS the command is directed. A suitable definition for the FPD chain identification value is as follows:

0x0—JTAG Chain
0x1—Altera Chain
0x2—Orca/Xilinx Chain.

Word 2, bits (3:0) identify the command to execute on the FPD chain. The command to execute is identified by a combination of FPD chain identification value and command field value. This allows the same command field value to result in the execution of different commands on different FPD chains.

Commands and associated command hexadecimal values specific to the JTAG chain are as follows:

Assert TRST*—0x8. Assert TRST* signal according to subsequent data field. TRST* is toggled according to the bits in the data field, with each bit indicating a high or low value for each clock pulse. TRST* retains the last value set by the data bits. TRST* is an active low signal with a power-on default of 1.

Assert TMS—0x9. Assert TMS signal according to subsequent data field. TMS is toggled according to the bits in the data field, with each bit indicating a high or low value for each clock pulse. TMS retains the last value set by the data bits. TMS is an active high signal with a power-on default of 0.

Drive TDI—0xA. Drive TDI signal according to subsequent data field. TDI is toggled according to the bits in the data field, with each bit indicating a high or low value for each clock pulse. TDO is returned to in-system programmable master ISPM over ISP bus 1 signal IDATAI with each clock signal. There will be a TDI to TDO offset that depends on the length of the JTAG FPD device chain connected to the ISPS JTAG chain interface.

Data Fields—After the two address and command words, a bit stream appropriate to the command is transmitted. Thee bit stream may be transmitted in blocks of arbitrary length, and all bits transmitted will be assumed to be data until signal N_ISYNC goes high, indicating the end of the information transfer. Not every command requires a data field. JTAG signal ITCK toggles for command values 0x8 to 0xF. ITCK remains low at all other times.

Commands and associated command hexadecimal values specific to the Xilinx/ORCA SRAM chain are as follows:

Deassert N_PRGM—0x0. Deasserts signal N_PRGM. This ends theiclear memory cycle and allows programming of the FPD.

Assert N_PRGM—0x1. Asserts signal N_PRGM. This initializes the programming cycle and clears FPD memory. In the preferred embodiment, in-system programmable master ISPM this signal is asserted for a specific interval, e.g., 10 microseconds.

Drive DOUT—0x8. Drive DOUT signal according to subsequent data field. DOUT is toggled according to the bits in the data field, with each bit indicating a high or low value for each clock pulse. This command is used when multiple ISPS chains are programmed in parallel. Signal IDADAI is left tri-stated so as not to have multiple drivers of this signal.

Drive DOUT, Sample N_INIT—0x9. Drive DOUT signal according to subsequent data field. DOUT is toggled according to the bits in the data field, with each bit indicating a high or low value for each clock pulse. Signal N_INIT from the FPD chain is monitored by in-system programmable master ISPM on ISP bus 1 signal IDATAI.

Drive DOUT, Sample DONE—0xA. Drive DOUT signal according to subsequent data field. DOUT is toggled according to the bits in the data field, with each bit indicating a high or low value for each clock pulse. Signal DONE from the FPD chain is monitored by in-system programmable master ISPM on ISP bus 1 signal IDATAI.

Data Field After the two address and command words, a bit stream appropriate to the command is transmitted. The bit stream may be transmitted in blocks of arbitrary length, and all bits transmitted will be assumed to be data until signal N_ISYNC goes high, indicating the end of the information transfer. Not every command requires a data field.

Xilinx/ORCA signal CCLK toggles for command values 0x8 to 0xF. CCLK remains low at all other times.

Commands and associated command hexadecimal values specific to the Altera SRAM chain are as follows:

Deassert N_CONFIG—0x0. Deasserts signal N_CONFIG. This ends the clear memory cycle and allows programming of the FPD.

Assert N_CONFIG—0x1. Asserts signal N_CONFIG. This initializes the programming cycle and clears FPD memory. In the preferred embodiment, this signal is asserted for a specific interval, e.g., 10 microseconds.

Drive DATAO—0x8. Drive DATAO signal according to subsequent data field. DATAO is toggled according to the bits in the data field, with each bit indicating a high or low value for each clock pulse. This command is used when multiple ISPS chains are programmed in parallel. Signal IDADAI is left tri-stated so as not to have multiple drivers of this signal.

Drive DATAO, Sample N_STATUS—0x9. Drive DATAO signal according to subsequent data field. DATAO is toggled according to the bits in the data field, with each bit indicating a high or low value for each clock pulse. Signal N_STATUS from the FPD chain is monitored by in-system programmable master ISPM on ISP bus 1 signal IDATAI.

Drive DATAO, Sample CONF_DONE—0xA. Drive DATAO signal according to subsequent data field. DATAO is toggled according to the bits in the data field, with each bit indicating a high or low value for each clock pulse. Signal CONF_DONE from the FPD chain is monitored by in-system programmable master ISPM on ISP bus 1 signal IDATAI.

Data Field—After the two address and command words, a bit stream appropriate to the command is transmitted. The bit stream may be transmitted in blocks of arbitrary length, and all bits transmitted will be assumed to be data until signal N_ISYNC goes high, indicating the end of the information transfer. Not every command requires a data field.

Altera signal DCLK toggles for command values 0x8 to 0xF. DCLK remains low at all other times.

In this particular implementation of the invention, a simplified approach was used wherein the only clock signal transmitted to an ISPS is the ISP bus 1 ICLK signal generated by in-system programmable master ISPM. N_ISYNC goes high after the last data bit is transmitted on ISP bus 1. Since the ISPS only samples on a trailing clock edge, a few additional clock pulses are required on signal ICLK for the ISPS to read and transmit the last data bit, to determine that signal N_ISYNC has gone high, and to move to the appropriate idle state. These additional ICLK clock pulses are generated by sending four data bits of arbitrary value. Since N_ISYNC is high, the arbitrary data bits will not be passed to the FPD, but the ICLK clock pulses will be used by the ISPS to advance to the next state.

In operation, commands and data sent through the ISPS are in the form of three fields transmitted through the SPI port or the ISPM device. A typical programming sequence will have the following format:

Address, Command(Assert Program Pin)—Address the command packet to the desired ISPS and chain and initialize a clear memory operation.

Wait n microseconds—Wait a specified period of time for the clear memory operation to complete. This wait is performed by the ISPM and is dependent on the FPD make and model being programmed.

Address, Command(Deassert Program Pin)—End the clear memory operation.

Wait m microseconds—Wait a specified period of time for the end clear memory operation to complete. This wait is performed by the ISPM and is dependent on the FPD make and model being programmed. The FPD is now ready for programming.

Address, Command(Send Data, Sample 'Done'), Data (data bits)—Send a bit stream containing the programming information. When programming is complete, the FPD will assert a 'Done' signal.

Data(data bits)—Send additional data bits as required for data driven commands.

Figure 3:
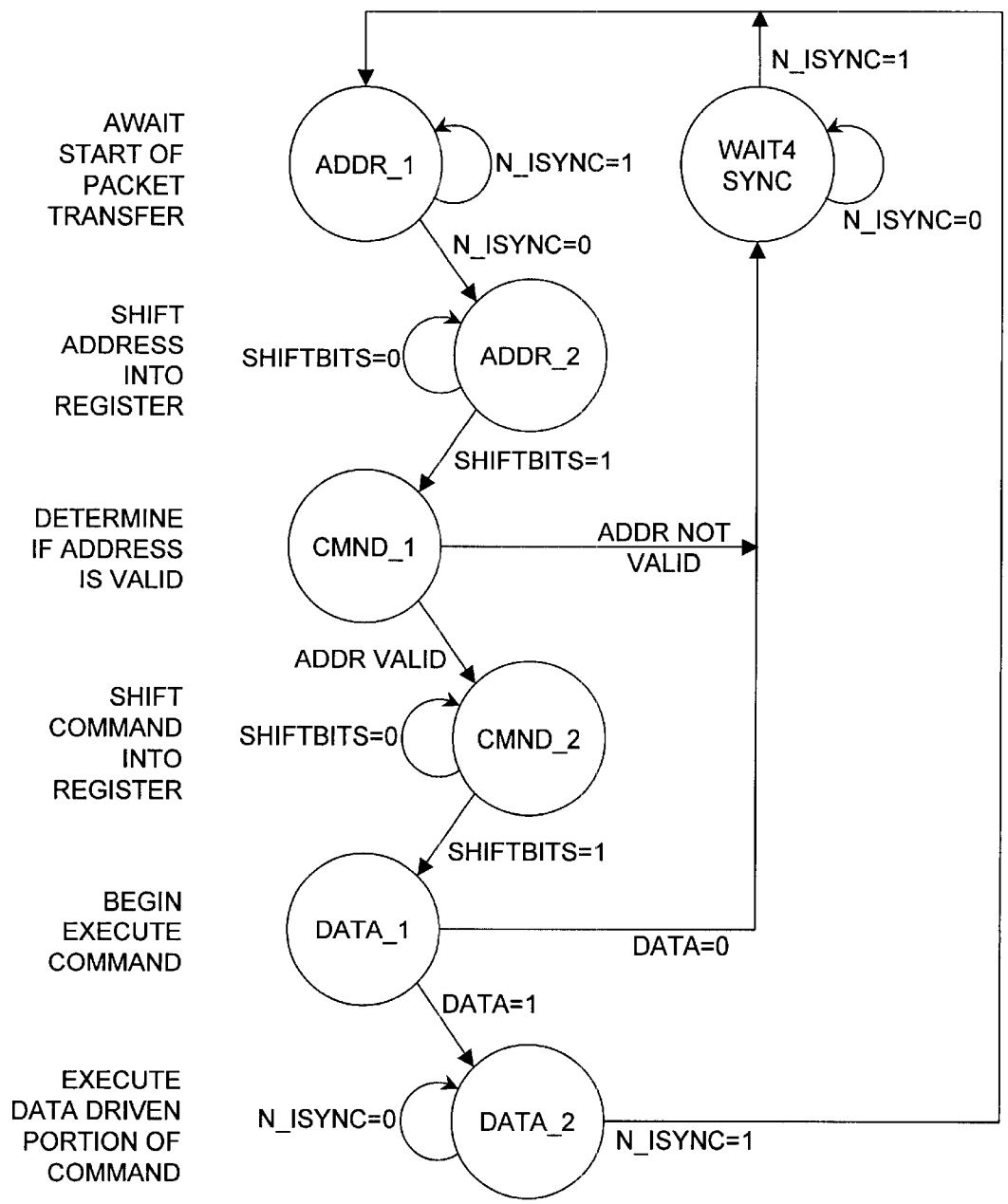
FIG. 3 shows a state diagram for the ISPS of the preferred embodiment of the present invention.

FIG. 3 shows the basic state diagram for the ISPS of the present invention. A description of the states is as follows:

ADDR_1—This is the initial state. The ISPS waits in this state while ISP bus 1 signal N_ISYNC is high, indicating that no packets are being transmitted over the bus.

ADDR_2—This state is arrived at from state ADDR_1 when ISP bus 1 signal N_ISYNC goes low, indicating that a packet is now being transmitted over the bus. In this state, the ISPS shifts the eight address bits of the packet into a shift register, and then sets variable SHIFTBITS to high.

CMND_1—This state is arrived at from state ADDR_2 when variable SHIFTBITS goes high, indicating that the packet address has been shifted into the shift register. In this state, the ISPS determines if the packet address is valid. If the packet address matches the card slot ID and ISPS_ID strapped into the ISPS address field, or the four high-order bits of the packet address are '1111' and the four low order bits match the ISPS_ID, then the packet address is valid.

CMND_2—This state is arrived at from state CMND_1 when state CMND_1 determines that the packet address is valid. In this state, the ISPS shifts the eight bits of chain select and command select into the shift register, and then sets variable SHIFTBITS to high.

DATA_1—This state is arrived at from state CMND_2 when the chain select and command select bits have been shifted into the shift register. In this state, the ISPS decodes and begins executing the desired command on the addressed FPD chain.

DATA_2—This state is arrived at from state DATA_1 when the command to execute is data driven (DATA=1). In this state, each data bit is read and the appropriate FPD interface signal is driven based on the bit value. When bus signal N_ISYNC goes high, there are no more data bits, and the ISPS moves to the initial ADDR_1 state.

WAIT4_SYNC—This state is arrived at from state CMND_1 when an, invalid address is detected, or from state DATA_1 when the command is not a data driven command. In this state, the ISPS waits until bus signal N_ISYNC goes high, indicating that the current packet transfer has completed and the bus is clear. The ISPS then returns to the initial ADDR_1 state.

A person of skill in the art will be aware that certain implementations of the ISPS will require modifications to the illustrated state machine to handle such issues as clock and timing.

Following is an illustrative simplified programming example that demonstrates how the ISPS would be used to program an ISP-capable JTAG device, then used to program an SRAM-based FPGA. In this example, the JTAG device is the only device on the JTAG chain. If there were more devices on the JTAG chain, then the ISPS 'data' field would be longer and include bypass vectors for the devices in the chain that are not being addressed.

The 'Sync Low' and 'Sync High' commands refer to the ISP bus 1 N_ISYNC signal. The 'Address', 'Command' and 'Data' fields are shifted out serially, least significant bit first, on the IDATA0 lead of ISP bus 1. The 'Data=xxxx' commands provide extra clock pulses, and the data value is ignored by the ISPS. The 'Address' field refers to the address of the ISPS device. For this example, an ISPS address of 0x0:1 is used. The 'Chain' field selects which of the three chains on the addressed ISPS are being selected. For this example, the chain addresses are:

0x0: JTAG Chain
0x1: Xillinx/ORCA SRAM Chain
0x2: Altera SRAM Chain.

For this example, the JTAG Chain, address 0x00, will be programmed. The programming example is as follows:

```
1) Assert JTAG Reset
# Control TMS to assert 'Test-Logic-Reset', then end
# up in 'Run-Test/Idle'.
Sync Low
Address = 00000001 (15:8)
Chain = 0000 (7:4)
Command = 1001 (3:0)                              # Drive TMS
Data = 01111111
Sync High
Data = xxxx (3:0)
2) Navigate to Shift-IR
# Control TMS to navigate to 'Shift-IR',
# then stay there.
Sync Low
Address = 00000001 (15:8)
Chain = 0000 (7:4)
Command = 1001 (3:0)                              # Drive TMS
Data = 0011
Sync High
Data = xxxx (3:0)
3) Shift in Instruction
# Shift data out on JTAG chain, remaining in
# 'Shift-IR' state.
Sync Low
Address = 00000001 (15:8)
Chain = 0000 (7:4)
Command = 1010 (3:0)                              # Drive TDI
Data = 11101000
Sync High
Data = xxxx (3:0)
4) Navigate to Shift-DR
# Control TMS to navigate to 'Shift-DR',
# then stay there.
Sync Low
Address = 00000001 (15:8)
Chain = 0000 (7:4)
Command = 1001 (3:0)                              # Drive TMS
Data = 0011101
Sync High
Data = xxxx (3:0)
5) Shift in Data
# Shift data out on JTAG, remaining
# in 'Shift-DR' state.
Sync Low
Address = 00000001 (15:8)
Chain = 0000 (7:4)
Command = 1010 (3:0)                              # Drive TDI
Data = 0011111111
Sync High
Data = xxxx (3:0)
6) Shift in more Data
# Shift data out on JTAG, remaining
# in 'Shift-DR' state.
Sync Low
Address = 00000001 (15:8)
Chain = 0000 (7:4)
Command = 1010 (3:0)                              # Drive TDI
Data = 1001101010011...01101001010010101010
Sync High
Data = xxxx (3:0)
7) Navigate to Test-Logic-Reset
# Control TMS to navigate to 'Test-Logic-Reset',
# end programming cycle.
Sync Low
Address = 00000001 (15:8)
Chain = 0010 (7:4)
Command = 1001 (3:0)                              # Drive TMS
Data = 11111111101101
Sync High
Data = xxxx (3:0)
# ***********************************************
# Continue programming on the Xilinx/ORCA SRAM-based
# FPGA, (Chain = 0x01)
8) Assert N_PRGM low
# Drive N_PRGRM pin low to clear memory and
# initialize the programming cycle.
Sync Low
Address = 00000001 (15:8)
Chain = 0001 (7:4)
Command = 0001 (3:0)                              # Drive
                                                  N_PRGM low
Sync High
Data = xxxx (3:0)
... ISPM waits for 10 microseconds ...
9) Assert N_PRGM high
# Drive N_PRGRM pin high to end initialization.
Sync Low
Address = 00000001 (15:8)
Chain = 0001 (7:4)
Command = 0000 (3:0)                              # Drive
                                                  N_PRGM high
Sync High
Data = xxxx (3:0)
... ISPM waits for 10 microseconds ...
```

-continued

```
10) Drive DOUT, sample DONE signal
# Drive DOUT with data field, monitoring
# the DONE lead.
Sync Low
Address = 00000001 (15:8)
Chain = 0001 (7:4)
Command = 1010 (3:0)                            # Drive DOUT
Data = 1001101010011. . .01101001010010101010
Sync High
```

NOTE:
The 'Data' field is typically very long. The DONE signal will signal the processor that the FPGA has been successfully programmed.

Other Embodiments

While an enabling disclosure of the preferred embodiment of the p;resent invention has been particularly described, other embodiments of the invention are within the scope of the following claims. It is intended that the scope of the invention be defined by the claims below and their equivalents.

For example, although the preferred embodiment shows a single FPD chain per FPD type on the ISPS, certain implementations may require more than one chain per ISP device type. Depending on the specific requirements, additional FPD chains can be designed into the ISPS, each having a unique address, or each having the same FPD same-type address.

Although a specific communications controller is used in the preferred embodiment for communications between the in-system programmable master ISPM and ISP bus 1, this ultimately will be a design decision based on requirements, desired technology and economics. A person of ordinary skill in the art will easily be able to implement the concepts of the present invention using a wide range of acceptable components.

In the preferred embodiment, in-system programmable master ISPM typically would be a system host processor. However, other implementations, such as a FPGA, will also work.

In the preferred embodiment, specific vendors and FPD types are shown. However, to one skilled in the art, it will be apparent that Applicant's invention is not limited to the specific vendors nor devices discussed in the preferred embodiment. Through the addition of additional signals on ISP bus 1, or, more likely, additional FPD programming commands, other programmable devices can be programmed in the manner of the present invention.

In the preferred embodiment, the clock signal for the ISPSs is generated by in-system programmable master ISPM and transmitted over ISP bus 1 signal ICLK. The clock signal may also come from other sources, such as a system clock unrelated to in-system programmable master ISPM.

In the preferred embodiment, ISP bus 1 signal N_ISYNC is used to indicate the first and last bits of a packet transfer. Synchronization could also be achieved by, for example, an embedded sync bit pattern detected at the ISPS.

What is claimed is:

1. A system for programming field programmable devices, comprising:

an in-system programmable master operated to generate a command packet and transmit said command packet onto an in-system programming bus; and one or more in-system programmable slaves, each of said slaves connected to said in-system programming bus, each of said slaves further connected to a plurality of chains of field programmable devices, each of said chains comprising one or more field programmable devices of the same programming type, at least one of said plurality of chains has a same programming type that is a different same programming type from at least one other of said plurality of chains, and each of said slaves operated to receive said command packet, to decode said command packet, and to transmit a field programmable device programming command onto one or more of said one or more chains.

2. A system for programming field programmable devices according to claim 1, wherein:

said command packet further comprises an address field, and a command field; and each of said chains is associated with an address, and each of said slaves is further operated to transmit said field programmable device programming command onto a chain if said chain is associated with said packet address field.

3. A system for programming field programmable devices according to claim 1, wherein said command packet is encoded in accordance with a predetermined protocol, and said field programmable device programming command is transmitted in accordance to the requirements of said programming type of said one or more of said chains.

* * * * *